US012672559B2

(12) United States Patent
Darmawikarta et al.

(10) Patent No.: US 12,672,559 B2
(45) Date of Patent: Jun. 30, 2026

(54) LOW INSERTION LOSS COAXIAL THROUGH-HOLE FOR HIGHSPEED INPUT-OUPUT

(71) Applicant: Intel Corporation, Santa Clara, CA (US)

(72) Inventors: Kristof Darmawikarta, Chandler, AZ (US); Kemal Aygun, Tempe, AZ (US); Brandon C. Marin, Gilbert, AZ (US); Srinivas Venkata Ramanuja Pietambaram, Chandler, AZ (US); Zhiguo Qian, Chandler, AZ (US); Jiwei Sun, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 138 days.

(21) Appl. No.: 17/853,204

(22) Filed: Jun. 29, 2022

(65) Prior Publication Data

US 2024/0006289 A1    Jan. 4, 2024

(51) Int. Cl.
| | |
|---|---|
| *H01L 23/498* | (2006.01) |
| *H01L 21/48* | (2006.01) |
| *H01L 23/66* | (2006.01) |
| *H10W 20/00* | (2026.01) |
| *H10W 42/20* | (2026.01) |
| *H10W 44/20* | (2026.01) |
| *H10W 70/05* | (2026.01) |
| *H10W 70/63* | (2026.01) |

(Continued)

(52) U.S. Cl.
CPC ....... *H10W 70/635* (2026.01); *H10W 20/056* (2026.01); *H10W 42/20* (2026.01); *H10W 44/20* (2026.01); *H10W 70/093* (2026.01); *H10W 70/095* (2026.01); *H10W 70/65* (2026.01); *H10W 44/248* (2026.01); *H10W 90/724* (2026.01)

(58) Field of Classification Search
CPC ........... H01L 23/49827; H01L 21/4853; H01L 21/486; H01L 21/76877; H01L 2223/6622; H01L 2223/6616
See application file for complete search history.

(56) References Cited

U.S. PATENT DOCUMENTS

| | | | | |
|---|---|---|---|---|
| 5,949,030 A * | 9/1999 | Fasano | .................... | H05K 1/115 174/265 |
| 8,624,127 B2 * | 1/2014 | Ishida | .................. | H05K 1/0222 174/265 |

(Continued)

*Primary Examiner* — Lawrence C Tynes, Jr.
(74) *Attorney, Agent, or Firm* — Essential Patents Group, LLP

(57)    ABSTRACT

An electronic device includes a substrate including a core layer having a first surface and a second surface opposite the first surface, and at least one coaxial through-hole extending vertically through the core layer from the first surface to the second surface. The coaxial through-hole includes at least a first through-via that includes electrically conductive material extending through the core layer from the first surface to the second surface, and a conductive layer including the same or different electrically conductive material extending vertically through the core layer from the first surface to the second surface and surrounding the first through-via. The conductive layer is to be connected to a ground voltage and is electrically isolated from the first through-via.

19 Claims, 5 Drawing Sheets

(51) Int. Cl.
    *H10W 70/65*        (2026.01)
    *H10W 90/00*        (2026.01)

(56)              References Cited

U.S. PATENT DOCUMENTS

| | | | |
|---|---|---|---|
| 2002/0179332 A1* | 12/2002 | Uematsu | H05K 1/115 |
| | | | 174/262 |
| 2017/0231083 A1* | 8/2017 | Wu | H01L 23/552 |
| 2021/0005550 A1* | 1/2021 | Chavali | H10D 1/20 |
| 2022/0346230 A1* | 10/2022 | Seo | H05K 1/0251 |

* cited by examiner

LOW INSERTION LOSS COAXIAL THROUGH-HOLE FOR HIGHSPEED INPUT-OUPUT

TECHNICAL FIELD

Embodiments pertain to packaging of integrated circuits (ICs). Some embodiments relate to a package substrate having a coaxial through-hole structure.

BACKGROUND

Electronic systems often include integrated circuits (ICs) that are connected to a subassembly such as a substrate of an electronic package that include many ICs. As electronic system designs become more complex, it is desired to increase the frequency of signals routed in electronic systems. A challenge with increasing signal frequency is insertion loss of the signals in the package substrate.

DETAILED DESCRIPTION

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

To meet the demand for increased functional complexity in smaller devices, manufacturers integrate multiple types of integrated circuits (ICs) dies in a single electronic package to create an efficient electronic system in a package. As package size increases to fit all the dies, the larger package size can be susceptible to warpage. To address warpage, a package substrate can include a stiffening core layer and a build-up layer on one or both surfaces the core layer.

Figure 1:
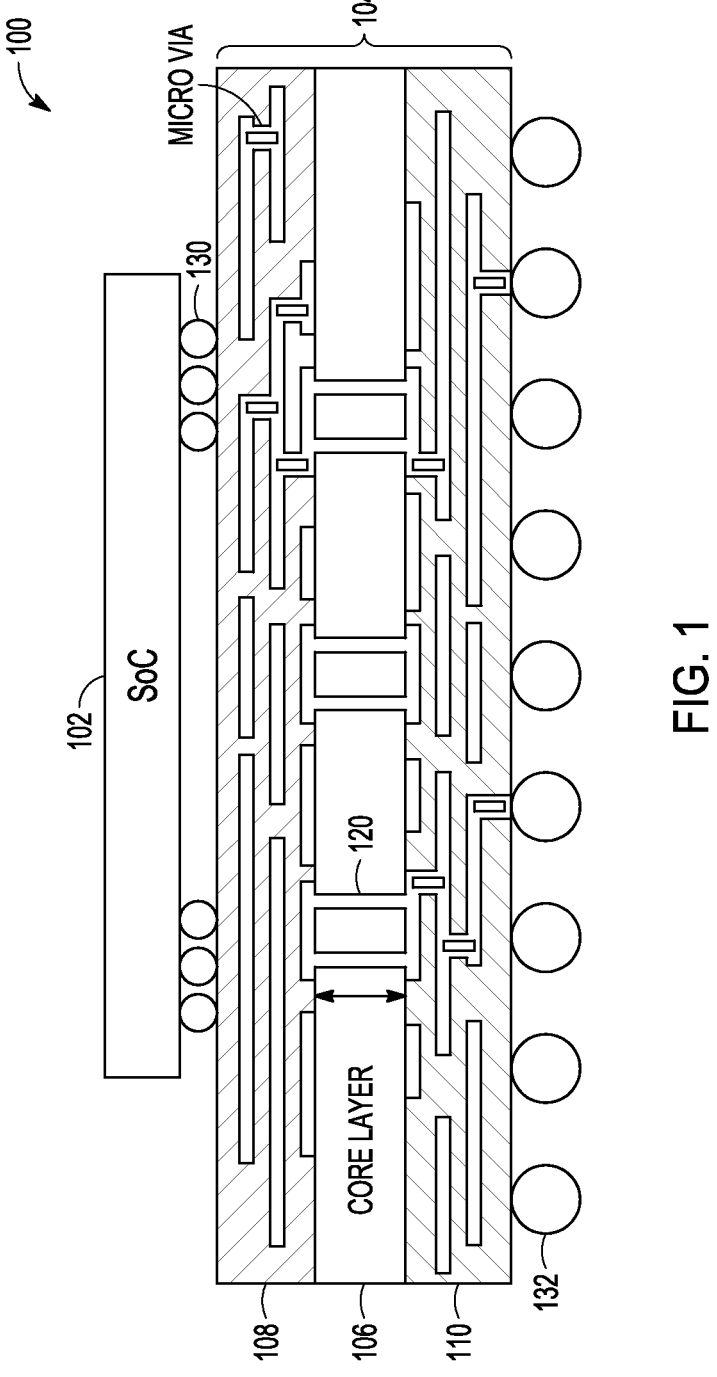
FIG. 1 is a side view of an example of portions of an electronic device in accordance with some embodiments.

FIG. 1 is a side view of an example of portions of an electronic device 100. The electronic device 100 includes a System on Chip (SoC) device 102 attached to a package substrate 104. The SoC 102 can include multiple integrated circuit (IC) die. The substrate 104 includes a core layer 106 and a build-up layer 108 (or redistribution layer) on the top surface and a build-up layer 110 on the bottom surface of the core layer 106. Signals are routed to the I/O of the SoC through the package substrate. The signals travel laterally and vertically within the build-up layer 108 and through vertically through the core layer 106 (e.g., through plated through via 120 to the other build-up layer 110.

The top build-up layer 108 has a first set of bonding pads to contact the solder bumps 130 of the SoC device 102. The bottom build-up layer 110 has a second set of bonding pads to contact solder bumps 132 on the bottom of the electronic device 100, such as for attachment to a mother board (not shown). The bottom bonding pads have a greater feature pitch size than the top bonding pads. The substrate 104 provides translation from the feature pitch size of the SoC to the different feature pitch size of the mother board.

It is desired to increase the speed of signals in electronic systems to achieve the next generation of high-speed input put (HSIO), but it is a challenge to overcome insertion loss of high-speed signals as they travel through the package substrate. Previous approaches to address insertion loss have primarily focused on the insertion loss through the build-up layers. Transmission lines are formed in the build-up layers and the insertion loss of the build-up layers is reduced by reducing the roughness of the transmission lines and lowering the loss tangent of the dielectric material of the build-up layers. Thus, the previous approaches to reduce insertion loss have addressed mostly the lateral travel of signals in the build-up layers but not the vertical travel of signals through the core layer.

Figures 2A, 2B:
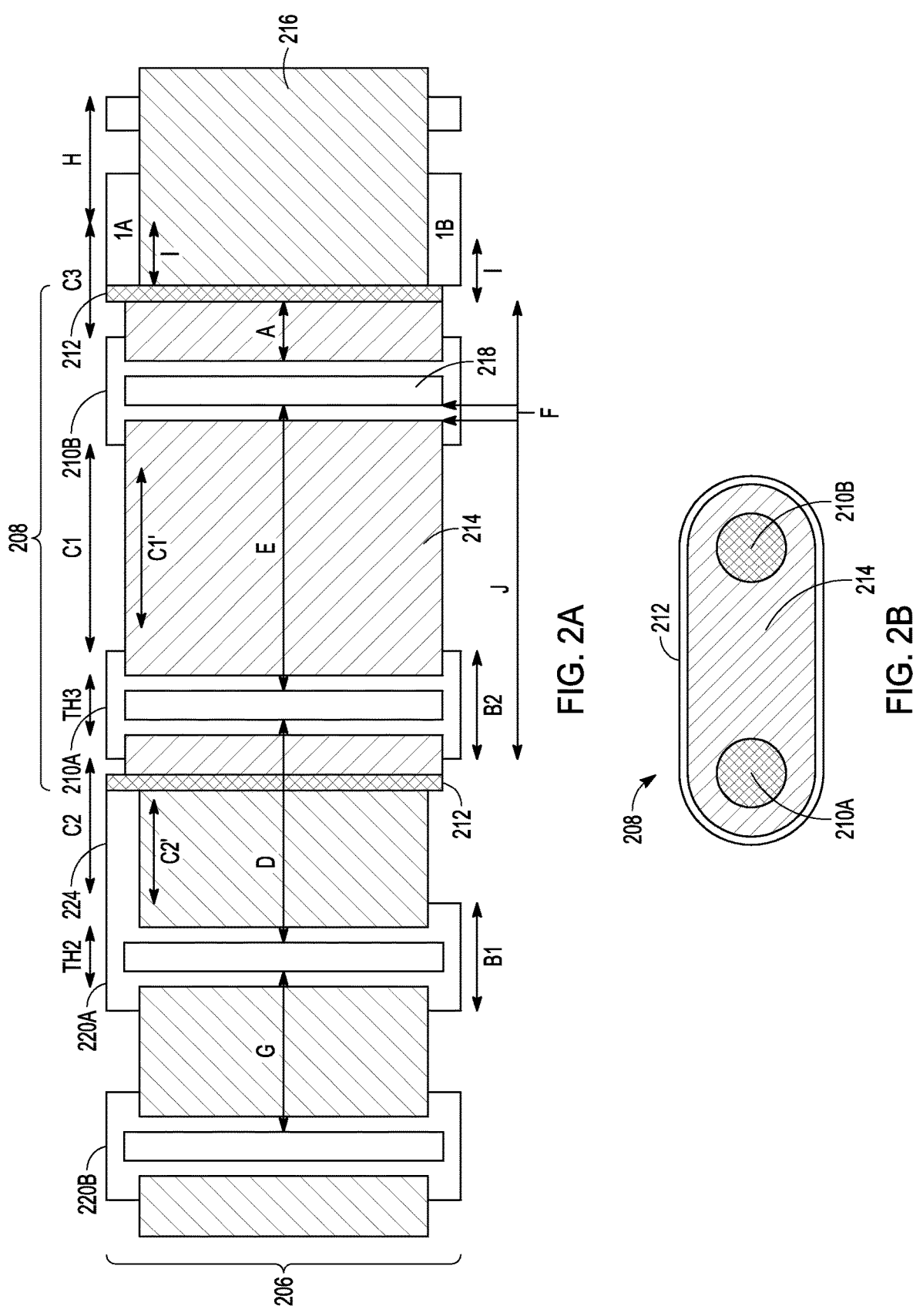
FIG. 2A is a side view of a portion of a core layer in accordance with some embodiments.
FIG. 2B is a top view of coaxial through-hole in accordance with some embodiments.

FIG. 2A is a side view of a portion of an improved core layer 206. The core layer 206 may be included in a substrate of an electronic device (e.g., the package substrate 104 of FIG. 1). To reduce insertion loss the core layer 206 includes a coaxial through-hole 208 in the core layer 206. The core layer 206 includes a top surface and a bottom surface. The coaxial through-hole 208 extends vertically through the core layer 206 from the top surface to the bottom surface and includes one or more through-vias 210 that are shielded electrically from other structures in the core layer 206.

The example in FIG. 2A includes two through-vias 210A, 210B that are shielded by a vertical shield wall 212 that is made of an electrically conductive material (e.g., metal). The through-vias 210A, 210B include an electrically conductive material that extends vertically through the core layer 206 from the first surface to the second surface within the shield wall 212. The electrically conductive material of the through-vias 210A, 210B may be the same used for the shield wall 212 or can be a different electrically conductive material. The vertical through-vias 210A, 210B are vertical signal lines. The through-vias 210A, 210B may carry a differential signal from a differential signal source or each through via may carry a single-ended signal. The shield wall 212 is electrically connected to a shield voltage (e.g., circuit ground). Because the vertical through-vias 210A, 210B are shielded, the insertion loss of a single-ended signal or a differential signal through the through-vias 210A, 210B is reduced.

FIG. 2B is a top view of the coaxial through-hole 208. FIG. 2B shows that the shield wall 212 is continuous and surrounds the through-vias 210A, 210B. The example of FIGS. 2A and 2B show two through-vias 210A, 210B that are within the closed shield wall, but the coaxial through-hole 208 may only include one through-via or can include more than two through-vias (e.g., three or four through-vias). If the coaxial through-hole 208 includes four through-vias, the through-vias may be arranged all in one row (e.g., a 4×1 matrix of through-vias) or arranged in two rows (e.g., a 4×2 matrix of through-vias). The through-vias 210A, 210B in FIG. 2B have a circular cross section, the cross section may be square or have another shape. FIG. 2B also shows that the area within the shield wall 212 is filled with a plug material 214. Outside the coaxial through-hole 208 shield wall is the core material 216 (e.g., a plastic or ceramic).

Returning to FIG. 2A, the electrically conductive material of the through-vias 210A, 210B are sidewalls of the through-vias 210A, 210B. If the cross section of the through-vias 210A, 210B is circular, the sidewalls of the through-vias 210A, 210B may form a cylinder. The center of the through-vias 210A. 210B is filled with a plug material 218 and then a conductive lid is added to one or both ends of the sidewalls (e.g., through metal plating). The plug material 218 within the through-vias 210A, 210B can be the same as the plug material 214 outside the through-vias 210A, 210B or can be a different plug material.

According to some examples, the plug material 214 outside the through-vias 210A, 210B has a lower dielectric constant (DK) than the plug material 214 within the through-vias 210A, 210B, making the volume inside the shield wall 212 a low DK plug. Some examples of plug material 214 than can be used for the low DK plug include, among other things, cyclotenes, benzocylcobutenes, paraffins, and perfluoroalkyl polymers. Other examples include epoxy-based materials plugged with porous fillers, hollow fillers or low-DK ceramic fillers. Some examples of low-DK ceramic fillers include, among other things, silicon carbon (SiC), fluorine doped silicon dioxide ($SiO_2$), or carbon doped oxide.

The example core layer 206 of FIG. 2A includes two through-vias 220A, 220B that are not within the shield wall 212. The core layer 206 includes a layer of electrically conductive interconnect on the top surface and the bottom surface. The interconnect 224 may be formed by metal plating the surface of the core and etching the metal plating. The shield wall 212 is connected to through-via 220A (e.g., by a metal trace). Through-via 220A can be connected to a shield voltage plane to provide the shield voltage to the shield wall 212. The shield wall 212 may extend vertically to the height of the low DK plug or extend to the height of a metal plating layer.

Figures 3A, 3B, 3C, 3D:
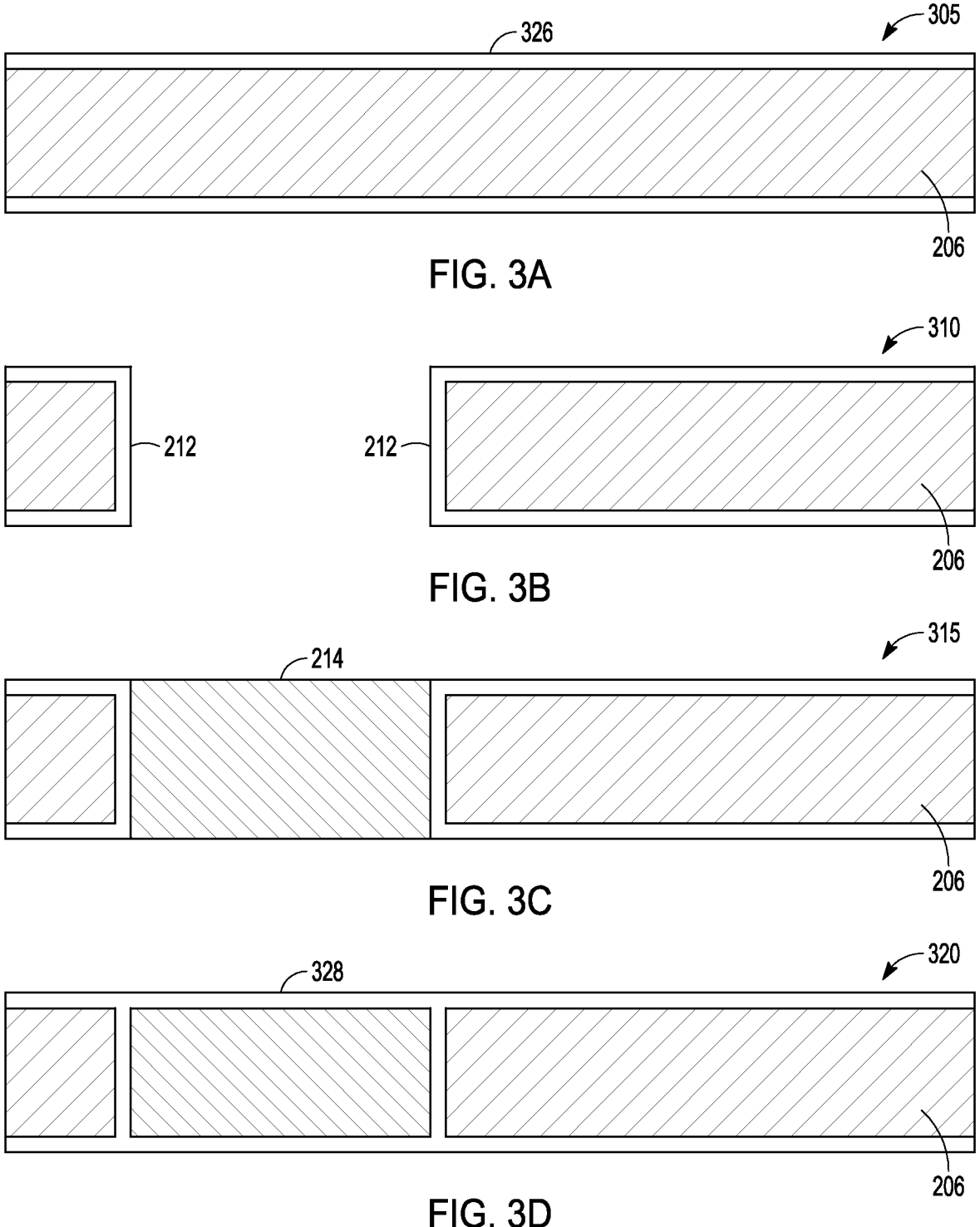
FIGS. 3A-3G show an example of a method of forming a coaxial through-hole in a core layer of a package substrate in accordance with some embodiments.

FIGS. 3A-3G show an example of a process flow of a method 300 of forming a coaxial through-hole in a core layer of a package substrate. In FIG. 3A, step 305 of the process flow shows a starting core layer 206 for a package substrate. The core layer 206 may include metal foil 326 (e.g., copper foil) on the top and bottom surface of the core layer 206.

At step 310 in FIG. 3B, an opening is made in the core layer 206 (e.g., by drilling). As an example, the diameter of the opening may be 800 micrometers (800 μm) with a range of 700-900 μm. The opening is coated with a conductive material (e.g., by metal plating with copper) to form the shield wall 212 of the coaxial through-hole. The shield wall 212 may be a continuous wall around the opening. As an example, the thickness of the shield wall 212 may be 18 μm+/−2 μm.

At step 315 in FIG. 3C, the opening is filled with the plug material 214 of the coaxial through-hole. The plug material may have a low DK to form a low DK plug in the opening. The plug material 214 is cured and may be ground to smooth top and bottom surfaces of the plug. At step 320 in FIG. 3D, the top and bottom surfaces of the core layer 206 and plug are coated with a metal 328 (e.g., by plating).

Figures 3E, 3F, 3G:
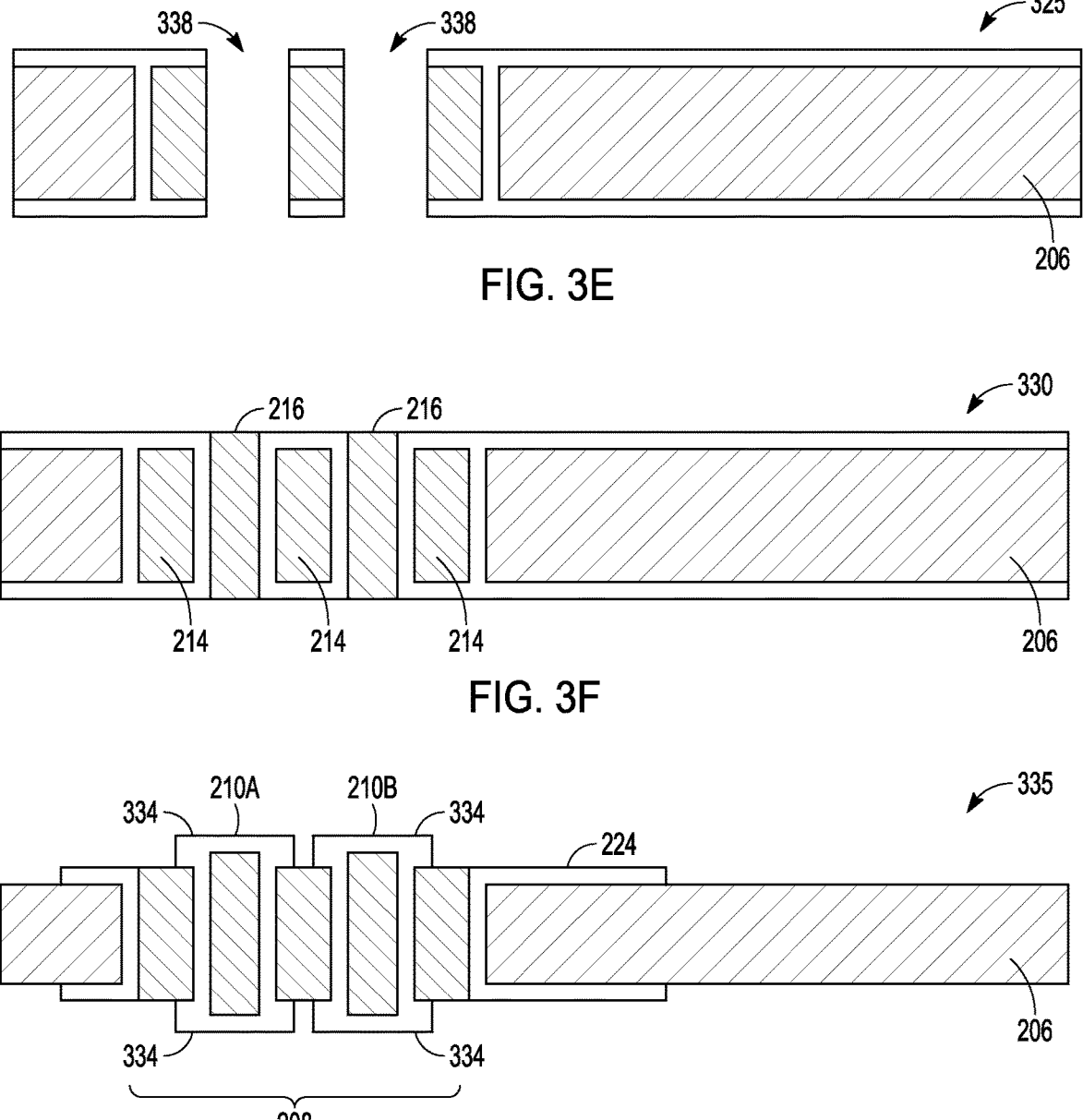

At step 325 in FIG. 3E, second and third openings 338 are formed in the plug material 214. The openings 338 are smaller than the first opening and are for through-vias that will be shielded by the shield wall 212. As examples, the diameter of the openings 338 may be 150 μm+/−15 μm, and the pitch between the openings may be 450 μm+/−20 μm. As another example, the minimum distance from an opening 338 to the shield wall is 22.5 μm.

At step 330 in FIG. 3F, the sidewall or sidewalls of the openings are coated with a metal. As an example, the thickness of the metal on a sidewall of a through-via within the low DK plug is 18 μm+/−2 μm. The second and third openings 338 are filled with a second plug material 218. The second plug material 218 may be the same as the first plug material 214 or may have a higher DK than the first plug material 214.

At step 335 in FIG. 3G, a lid or contact pad 334 is plated onto one or both ends of the filled openings to form through-vias 210A, 210B of the coaxial through-hole. The contact pads 334 contact the sidewalls of the through-vias 210A, 210B. As an example, the minimum pad size for the through-vias 210A, 210B may be 295 μm and the minimum spacing between contact pads 334 may be 155 μm. Photolithography can be used to form interconnect on the core layer 206. The interconnect can provide electrical continuity to a bonding pad of an IC (e.g., the SoC 102 in FIG. 1) to a coaxial through-hole. Conductive interconnect 224 can connect to the shield wall 212.

Other openings (e.g., a fourth opening or more openings) may be formed outside the area enclosed by the shield wall 212 for non-shielded through-vias 220A, 220B in FIG. 2A. As examples, the diameter of the non-shielded through-vias 220A, 220B may be 150 μm+/−15 μm, the pitch between non-shielded through vias 220A, 220B may be 325 μm+/−30 μm, the pitch from a non-shielded through-via 220A to a shielded through-via 210A may be 412 μm+/−25 μm, the minimum pad size for a non-shielded through-via 220A, 220B may be 265 μm, and the minimum spacing between a contact pad of a non-shielded through-vias 220A to the shield wall 212 may be 104.5 um+/−12 μm.

The methods, devices, and systems described herein provide signal lines through a core layer of a package substrate with reduced signal insertion loss. An example of an electronic device using assemblies with electronic device packaging as described in the present disclosure is included to show an example of a higher level device application.

Figure 4:
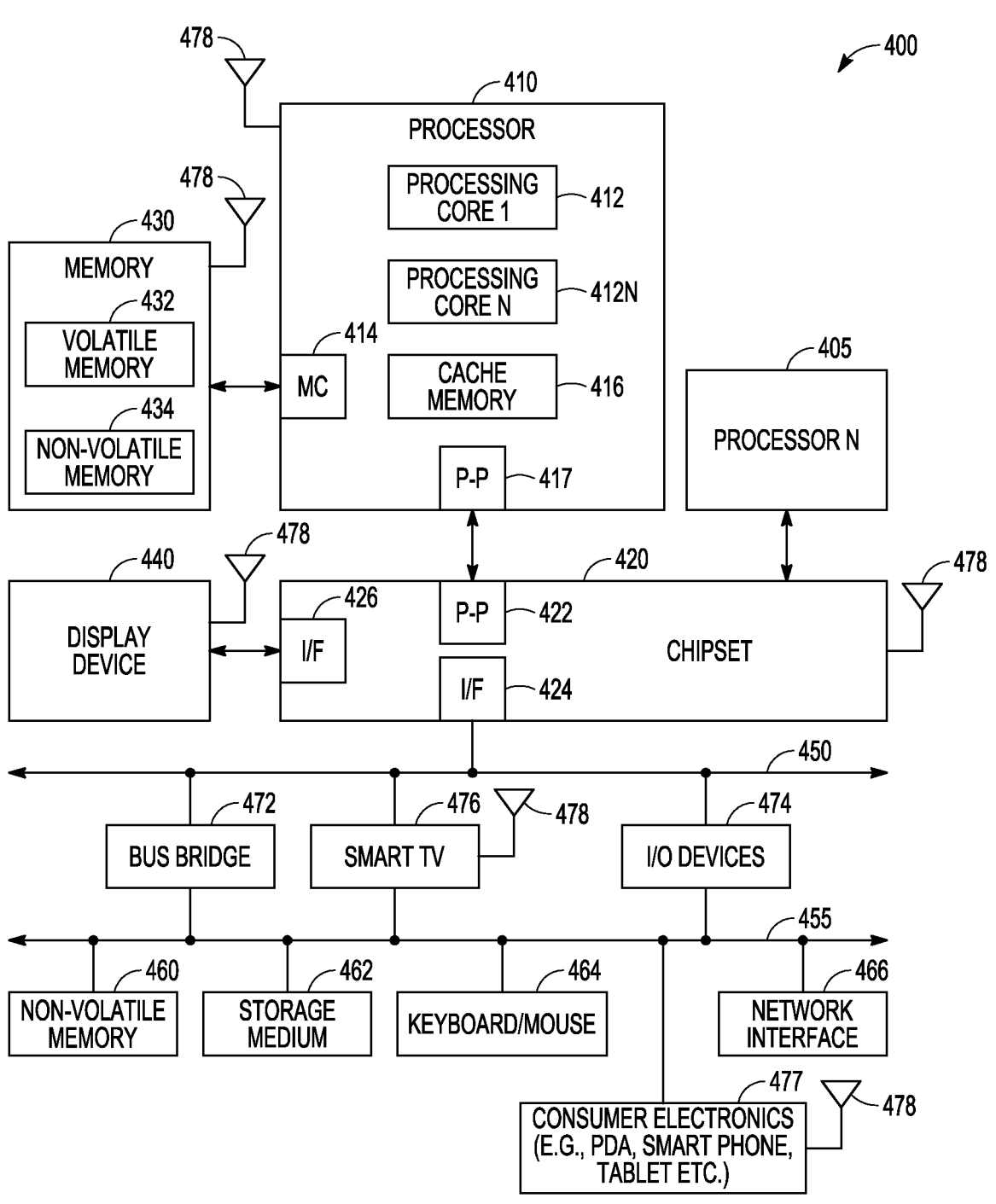
FIG. 4 illustrates a system level diagram in accordance with some embodiments.

FIG. 4 illustrates a system level diagram, according to one embodiment of the invention. For instance, FIG. 4 depicts an example of a system that can include an electronic device with a package substrate having a one or more coaxial through-hole structures. In one embodiment, system 400 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance, or any other type of computing device. In some embodiments, system 400 is a system on a chip (SOC) system.

In one embodiment, processor 410 has one or more processing cores 412 and 412N, where N is a positive integer and 412N represents the Nth processor core inside processor 410. In one embodiment, system 400 includes multiple processors including 410 and 405, where processor 405 has logic similar or identical to the logic of processor 410. In some embodiments, processing core 412 includes, but is not limited to, pre-fetch logic to fetch instructions, decode logic to decode the instructions, execution logic to execute instructions and the like. In some embodiments, processor 410 has a cache memory 416 to cache instructions and/or data for system 400. Cache memory 416 may be organized into a hierarchal structure including one or more levels of cache memory.

In some embodiments, processor 410 includes a memory controller 414, which is operable to perform functions that enable the processor 410 to access and communicate with memory 430 that includes a volatile memory 432 and/or a non-volatile memory 434. In some embodiments, processor 410 is coupled with memory 430 and chipset 420. Processor 410 may also be coupled to a wireless antenna 478 to communicate with any device configured to transmit and/or receive wireless signals. In one embodiment, the wireless antenna interface 478 operates in accordance with, but is not limited to, the IEEE 802.11 standard and its related family, Home Plug AV (HPAV), Ultra-Wide Band (UWB), Bluetooth, WiMax, or any form of wireless communication protocol.

In some embodiments, volatile memory 432 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 434 includes, but is not limited to, flash memory, phase change memory (PCM), read-only memory (ROM), electrically erasable programmable read-only memory (EEPROM), or any other type of non-volatile memory device.

Memory 430 stores information and instructions to be executed by processor 410. In one embodiment, memory 430 may also store temporary variables or other intermediate information while processor 410 is executing instructions. In the illustrated embodiment, chipset 420 connects with processor 410 via Point-to-Point (PtP or P-P) interfaces 417 and 422. Chipset 420 enables processor 410 to connect to other elements in system 400. In some embodiments of the invention, interfaces 417 and 422 operate in accordance with a PtP communication protocol such as the Intel® QuickPath Interconnect (QPI) or the like. In other embodiments, a different interconnect may be used.

In some embodiments, chipset 420 is operable to communicate with processor 410, 405N, display device 440, and other devices 472, 476, 474, 460, 462, 464, 466, 477, etc. Buses 450 and 455 may be interconnected together via a bus bridge 472. Chipset 420 connects to one or more buses 450 and 455 that interconnect various elements 474, 460, 462, 464, and 466. Chipset 420 may also be coupled to a wireless antenna 478 to communicate with any device configured to transmit and/or receive wireless signals. Chipset 420 connects to display device 440 via interface (I/F) 426. Display 440 may be, for example, a touchscreen, a liquid crystal display (LCD), a plasma display, cathode ray tube (CRT) display, or any other form of visual display device. In some embodiments of the invention, processor 410 and chipset 420 are merged into a single SOC. In one embodiment, chipset 420 couples with (e.g., via interface 424) a non-volatile memory 460, a mass storage medium 462, a keyboard/mouse 464, and a network interface 466 via I/F 424 and/or I/F 426, I/O devices 474, smart TV 476, consumer electronics 477 (e.g., PDA, Smart Phone, Tablet, etc.).

In one embodiment, mass storage medium 462 includes, but is not limited to, a solid state drive, a hard disk drive, a universal serial bus flash memory drive, or any other form of computer data storage medium. In one embodiment, network interface 466 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra-Wide Band (UWB), Bluetooth, WiMax, or any form of wireless communication protocol.

While the modules shown in FIG. 4 are depicted as separate blocks within the system 400, the functions performed by some of these blocks may be integrated within a single semiconductor circuit or may be implemented using two or more separate integrated circuits. For example, although cache memory 416 is depicted as a separate block within processor 410, cache memory 416 (or selected aspects of 416) can be incorporated into processor core 412.

The devices, systems, and methods described can provide improved signal routing in an electronic package by providing a reduced insertion loss through-hole structures. Examples described herein include one SoC for simplicity, but one skilled in the art would recognize upon reading this description that the examples can include more than one SoC system.

To better illustrate the method and apparatuses disclosed herein, a non-limiting list of embodiments is provided here:

Example 1 includes subject matter (such as an electronic device) comprising a substrate including a core layer having a first surface and a second surface opposite the first surface, and at least one coaxial through-hole extending vertically through the core layer from the first surface to the second surface. The coaxial through-hole includes at least a first through-via that includes electrically conductive material extending through the core layer from the first surface to the second surface; and a conductive layer including the same or different electrically conductive material extending vertically through the core layer from the first surface to the second surface and surrounding the first through-via, wherein the conductive layer is electrically isolated from the first through-via and is to be connected to a ground voltage.

In Example 2, the subject matter of Example 1 optionally includes a coaxial through-hole that includes a second through-via that includes electrically conductive material extending through the core layer from the first surface to the second surface, the first and second through-vias surrounded by the conductive layer, and the first and second through-vias are connected to a differential signal source.

In Example 3, the subject matter of Example 1 optionally includes a coaxial through-hole that includes a second through-via and the conductive layer surrounds the first and second through-vias. The coaxial through-hole includes a first plug material disposed within the conductive layer and surrounding the first and second through-vias, wherein the first plug material has a first dielectric constant, and the first and second through-vias include a sidewall of the electrically conductive material and are filled with a second plug material having a second dielectric constant higher than the first plug material.

In Example 4, the subject matter of Example 3 optionally includes the first plug material including at least one of a cyclotene, a benzocyclobutene, a paraffin, or a perfluoroalkyl polymer.

In Example 5, the subject matter of Example 3 optionally includes the first plug material including an epoxy-based material plugged with at least one of a porous filler, a hollow filler, or a ceramic filler with a dielectric constant less than the second plug material.

In Example 6, the subject matter of one or any combination of Examples 2-5 optionally includes a third through-via disposed outside the conductive layer.

In Example 7, the subject matter of Example 6 optionally includes the third through-via connected to the conductive layer and to a shield voltage plane.

In Example 8, the subject matter of one or any combination of Examples 3-7 optionally includes a first build-up layer contacting the first surface of the core layer, and including first bonding pads, and a second build-up layer contacting the second surface of the core layer and including second bonding pads having a different pitch size than the first bonding pads.

Example 9 includes subject matter (such as a forming at least one coaxial through-hole in a core layer of a package substrate) or can optionally be combined with one or any combination of Examples 1-8 to include such subject matter comprising forming a first opening in the package substrate, coating a sidewall of the first opening with an electrically conductive material to form a conductive layer, forming a second opening in the first plug material with the first plug material surrounding the second opening, coating a sidewall of the second opening with the same or different electrically conductive material and the sidewall of the second opening having two ends, filling the second opening with a second plug material that is the same or different than the first plug material, and plating at least one end of the sidewall of the second opening to form a first through-via within the conductive layer.

In Example 10, the subject matter of Example 9 optionally includes forming a third opening in the first plug material with the first plug material surrounding the third opening, coating a sidewall of the third opening with the same or different electrically conductive material so that the sidewall of the third opening has two ends, filling the third opening with the second plug material, and plating at least one end of the sidewall of the third opening to form a second through-via within the conductive layer.

In Example 11, the subject matter of Example 10 optionally includes forming a fourth opening in the package substrate; coating a sidewall of the fourth opening with the same or different electrically conductive material so that the sidewall of the fourth opening has two ends, filling the fourth opening with the second plug material, and plating at least one end of the sidewall of the fourth opening to form a third through-via outside the conductive layer.

In Example 12, the subject matter of Example 11 optionally includes connecting the third through-via to the conductive layer.

In Example 13, the subject matter of one or any combination of Examples 10-12 optionally includes plating a first surface and a second surface of the first plug material, and forming the second and third openings in the plated first plug material.

In Example 14, the subject matter of one or any combination of Examples 9-13 optionally includes filling the first opening with the first plug material includes filling the first opening with at least one of a cyclotene, a benzocyclobutene, a paraffin, or a perfluoroalkyl polymer.

In Example 15, the subject matter of one or any combination of Examples 9-13 optionally includes filling the first opening with an epoxy-based material plugged with at least one of a porous filler, a hollow filler, or a ceramic filler with a dielectric constant less than the second plug material.

Example 16 includes subject matter (such as a packaged electronic system) or can optionally be combined with the one or any combination of Examples 1-15 to include such subject matter, comprising a package substrate, an integrated circuit (IC), and an antenna operatively coupled to the IC die. The package substrate includes a core layer having a first surface and a second surface opposite the first surface, and at least one coaxial through-hole extending vertically through the core layer from the first surface to the second surface. The coaxial through-hole includes at least a first through-via that includes electrically conductive material extending through the core layer from the first surface to the second surface, and a conductive layer including the same or different electrically conductive material extending vertically through the core layer from the first surface to the second surface and surrounding the first through-via. The conductive layer is electrically isolated from the first through-via and is to be connected to a ground voltage. The package substrate also includes a first build-up layer having a bottom surface contacting the first surface of the core layer and an end of the at least one coaxial through-hole. The IC is mounted on the top surface of the first build-up layer, wherein the first build-up layer includes electrically conductive interconnect that provides electrical continuity between a bonding pad of the IC die and the at least one coaxial through-hole.

In Example 17, the subject matter of Example 16 optionally includes a second through-via that includes electrically conductive material extending through the core layer from the first surface to the second surface, the first and second through-vias surrounded by the conductive layer, and the first and second through-vias are connected to a differential signal source.

In Example 18, the subject matter of one or both of Examples 16 and 17 optionally includes a second build-up layer contacting the second surface of the core layer. The first build-up layer includes first bonding pads, the second build-up layer includes second bonding pads, and the second bonding pads have a different pitch size than the first bonding pads.

In Example 19, the subject matter of Example 18 optionally includes the second build-up layer includes electrically conductive interconnect that provides electrical continuity between the at least one coaxial through-hole and at least one of the second bonding pads.

In Example 20, the subject matter of one or any combination of Examples 16-19 optionally includes at least one coaxial through-hole including a second through-via and the conductive layer surrounds the first and second through-vias, and a first plug material disposed within the conductive layer and surrounding the first and second through-vias. The first plug material has a first dielectric constant. The first and second through-vias include a sidewall of the electrically conductive material and are filled with a second plug material having a second dielectric constant higher than the first plug material.

In Example 21, the subject matter of one or any combination of Examples 16-20 optionally includes a third through-via disposed outside the conductive layer and connected to the conductive layer and to a shield voltage plane.

These non-limiting examples can be combined in any permutation or combination. The Abstract is provided to allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

What is claimed is:

1. An electronic device, comprising:

a substrate comprising a core layer having a first surface and a second surface opposite the first surface; and at least one coaxial through-hole extending vertically through the core layer from the first surface to the second surface, wherein the coaxial through-hole comprises:

at least a first through-via that comprises electrically conductive material extending through the core layer from the first surface to the second surface;

a conductive layer comprising the same or a different electrically conductive material and extending vertically through the core layer from the first surface to the second surface, wherein the conductive layer is to be connected to a ground voltage and is electrically isolated from the first through-via;

a second through-via, wherein the conductive layer surrounds the first and second through-vias; and a first plug material within the conductive layer and surrounding the first and second through-vias, wherein the first plug material has a first dielectric constant, and wherein the first and second through-vias comprise a sidewall of the electrically conductive material and are filled with a second plug material having a second dielectric constant higher than the first dielectric constant.

2. The electronic device of claim 1, wherein the first and second through-vias are connected to a differential signal source.

3. The electronic device of claim 1, wherein the first plug material comprises at least one of a cyclotene, a benzocyclobutene, a paraffin, or a perfluoroalkyl polymer.

4. The electronic device of claim 1, wherein the first plug material comprises an epoxy-based material plugged with at least one of a porous filler, a hollow filler, or a ceramic filler with a dielectric constant less than the second plug material.

5. The electronic device of claim 1, comprising a third through-via disposed outside the conductive layer.

6. The electronic device of claim 5, wherein the third through-via is connected to the conductive layer and to a ground voltage plane.

7. The electronic device of claim 1, comprising:

a first build-up layer contacting the first surface of the core layer, and comprising first bonding pads; and a second build-up layer contacting the second surface of the core layer and comprising second bonding pads having a different pitch size than the first bonding pads.

8. A method of forming at least one coaxial through-hole in a core layer of a package substrate, comprising:

forming a first opening in the package substrate;

coating a sidewall of the first opening with an electrically conductive material, thereby forming a conductive layer;

filling the first opening with a first plug material;

forming a second opening in the first plug material with the first plug material surrounding the second opening;

coating a sidewall of the second opening with the same or different electrically conductive material, the sidewall of the second opening having two ends;

filling the second opening with a second plug material that is the same or different than the first plug material;

plating at least one end of the sidewall of the second opening to form a first through-via within the conductive layer that is electrically isolated from the conductive layer;

forming a third opening in the first plug material with the first plug material surrounding the third opening;

coating a sidewall of the third opening with the same or different electrically conductive material, the sidewall of the third opening having two ends;

filling the third opening with the second plug material; and plating at least one end of the sidewall of the third opening to form a second through-via within the conductive layer.

9. The method of claim 8, comprising:

forming a fourth opening in the package substrate;

coating a sidewall of the fourth opening with the same or different electrically conductive material, the sidewall of the fourth opening having two ends;

filling the fourth opening with the second plug material; and plating at least one end of the sidewall of the fourth opening to form a third through-via outside the conductive layer.

10. The method of claim 9, comprising connecting the third through-via to the conductive layer.

11. The method of claim 8, comprising:

plating a first surface and a second surface of the first plug material to form a plated first plug material, wherein forming the second and third openings comprises forming the second and third openings in the plated first plug material.

12. The method of claim 8, wherein filling the first opening with the first plug material comprises filling the first opening with at least one of a cyclotene, a benzocyclobutene, a paraffin, or a perfluoroalkyl polymer.

13. The method of claim 8, wherein filling the first opening with the first plug material comprises filling the first opening with an epoxy-based material plugged with at least one of a porous filler, a hollow filler, or a ceramic filler with a dielectric constant less than the second plug material.

14. A packaged electronic system, comprising:

a package substrate comprising:

a core layer having a first surface and a second surface opposite the first surface; and at least one coaxial through-hole extending vertically through the core layer from the first surface to the second surface, wherein the coaxial through-hole comprises:

at least a first through-via that comprises electrically conductive material extending through the core layer from the first surface to the second surface; and a conductive layer comprising the same or different electrically conductive material extending vertically through the core layer from the first surface to the second surface and surrounding the first through-via, wherein the conductive layer is to be connected to a ground voltage and is electrically isolated from the first through-via; and a first build-up layer having a bottom surface contacting the first surface of the core layer and an end of the at least one coaxial through-hole;

an integrated circuit (IC) die mounted on a top surface of the first build-up layer, wherein the first build-up layer comprises an electrically conductive interconnect that provides electrical continuity between a bonding pad of the IC die and the at least one coaxial through-hole; and an antenna operatively coupled to the IC die.

15. The system of claim 14, wherein the at least one coaxial through-hole comprises a second through-via that comprises electrically conductive material extending through the core layer from the first surface to the second surface, the first and second through-vias surrounded by the conductive layer, and wherein the first and second through-vias are connected to a differential signal source.

16. The system of claim 14, wherein the package substrate comprises a second build-up layer contacting the second surface of the core layer, wherein the first build-up layer comprises first bonding pads, the second build-up layer comprises second bonding pads, and the second bonding pads have a different pitch size than the first bonding pads.

17. The system of claim 16, wherein the second build-up layer comprises an electrically conductive interconnect that provides electrical continuity between the at least one coaxial through-hole and at least one of the second bonding pads.

18. The system of claim 14, wherein the at least one coaxial through-hole comprises a second through-via and the conductive layer surrounds the first and second through-vias, and a first plug material within the conductive layer and surrounding the first and second through-vias, wherein the first plug material has a first dielectric constant, and wherein the first and second through-vias comprise a sidewall of the electrically conductive material and are filled with a second plug material having a second dielectric constant higher than the first plug material.

19. The system of claim 14, comprising a third through-via outside the conductive layer and connected to the conductive layer and to a ground voltage plane.

* * * * *